United States Patent [19]
Takano

[11] Patent Number: 5,629,946
[45] Date of Patent: May 13, 1997

[54] HIGH SPEED TEST PATTERN GENERATOR

[75] Inventor: Kazuo Takano, Menuma-machi, Japan

[73] Assignee: Advantest Corporation, Tokyo, Japan

[21] Appl. No.: 362,796

[22] Filed: Dec. 22, 1994

[30] Foreign Application Priority Data

Dec. 28, 1993 [JP] Japan .................................. 5-350145

[51] Int. Cl.[6] .................................................. G01R 31/28
[52] U.S. Cl. ............................ 371/27; 371/25.1; 371/21.5
[58] Field of Search ................................ 371/27, 20, 25,
371/22.3, 15, 21, 25.1, 21.5; 364/900, 745

[56] References Cited

U.S. PATENT DOCUMENTS

| | | | |
|---|---|---|---|
| 4,293,950 | 10/1981 | Shimizu et al. | 371/21 |
| 4,897,837 | 1/1990 | Ishihara et al. | 371/22.3 |
| 4,905,183 | 2/1990 | Kawaguchi et al. | 364/900 |
| 5,337,045 | 8/1994 | Shirasaka | 340/825 |
| 5,390,192 | 2/1995 | Fujieda | 371/27 |
| 5,432,726 | 7/1995 | Kurohmaru et al. | 364/745 |

Primary Examiner—Hoa T. Nguyen
Assistant Examiner—Nadeem Iqbal
Attorney, Agent, or Firm—Knobbe, Martens, Olson & Bear, LLP

[57] ABSTRACT

A test pattern generator which is capable of generating a test pattern with high speed without requiring complicated programming is disclosed. The test pattern generator includes a parallel circuit for converting an instruction signal of a serial form to n instruction signals of a parallel form, an instruction processing circuit having n−1 instruction processors for performing arithmetic operations based on two instruction data out of the instruction signals given in the parallel form and a plurality of sets of registers each set of which is commonly provided a lower speed clock signal, an arithmetic circuit for receiving the parallel data from the instruction processing circuit and performing arithmetic operations by n arithmetic units therein and including a register which provides the data in the previous cycle to the other inputs of all of the arithmetic units, a multiplexing circuit for converting the parallel data from the arithmetic circuit to a serial form having n times faster than the parallel data based on a higher speed clock having n times faster speed of the lower speed clock signal.

3 Claims, 14 Drawing Sheets

| COMMAND |
|---|
| + : ADDITION |
| − : SUBRACTION |
| = : SUBSTITUTION |
| ±0 : NO COMPUT. |

| i0 | i1 | RESULT 1 |
|---|---|---|
| +a | +b | +(a+b) |
| +a | −b | +(a+b) : a>b <br> −(b−a) : a<b |
| +a | =b | =(b) |
| +a | ±0 | +(a) |
| −a | −b | −(a+b) |
| −a | +b | −(a−b) : a>b <br> +(b−a) : a<b |
| −a | =b | =(b) |
| −a | ±0 | −(a) |
| =a | +b | =(a+b) |
| =a | −b | =(a−b) |
| =a | =b | =(b) |
| =a | ±0 | =(a) |
| ±0 | +b | +(b) |
| ±0 | −b | −(b) |
| ±0 | =b | =(b) |
| ±0 | ±0 | ±0 |

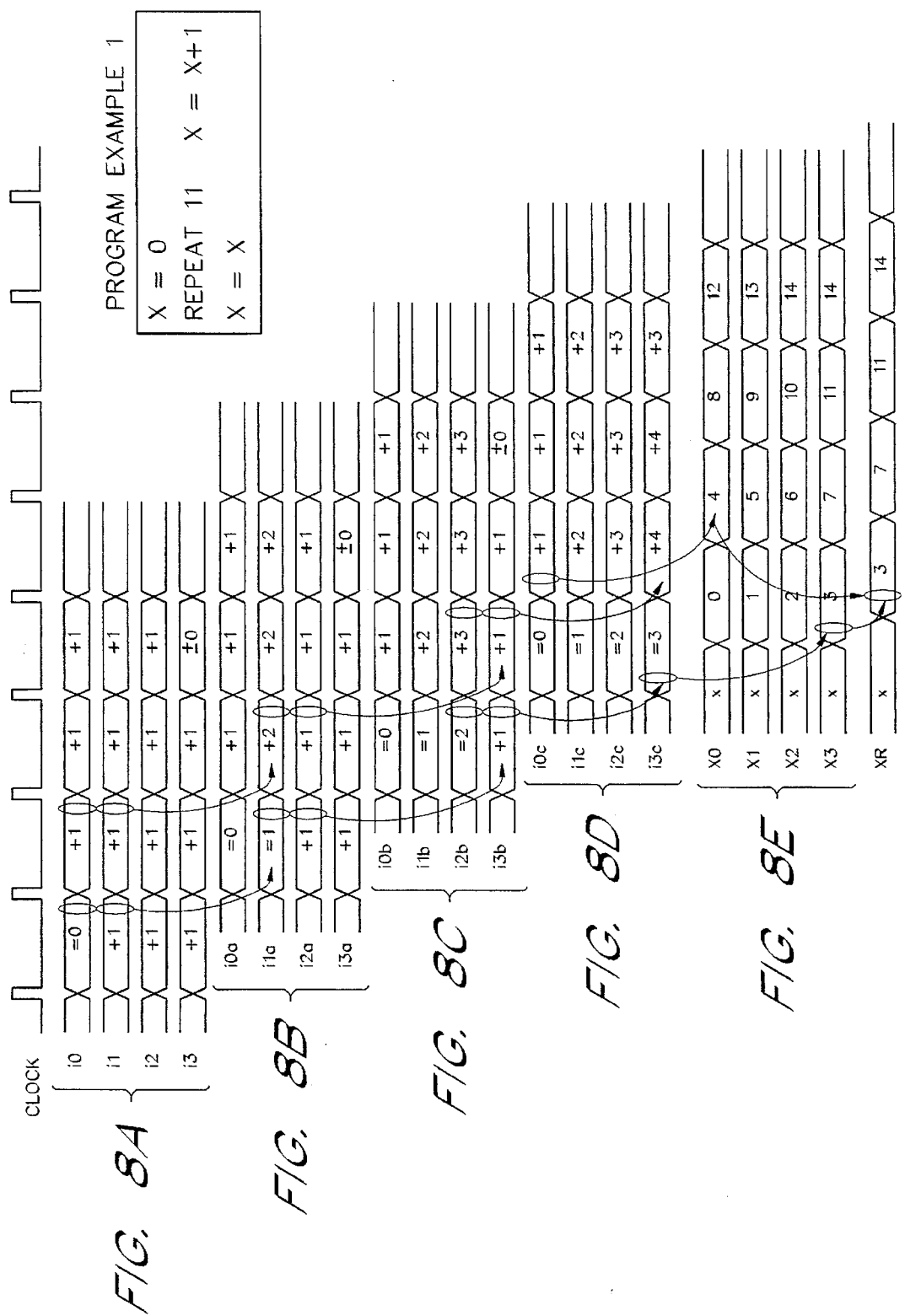

PROGRAM EXAMPLE 2

```
X = 0
REPEAT 4    X = X+1
X = 8
REPEAT 6    X = X-1
```

(CYCLE 5)

(CYCLE 6)

HIGH SPEED TEST PATTERN GENERATOR

FIELD OF THE INVENTION

This invention relates to a test pattern generator which is incorporated in a semiconductor test system, and more particularly, to a test pattern generator which realizes a high speed operation for generating a test pattern without requiring a complicated programming procedure.

BACKGROUND OF THE INVENTION

Generally, a test pattern used in a semiconductor test system for testing a semiconductor device is very lengthy and large scale. Further, in a semiconductor memory testing, for example, a test pattern tends to repeat the same portion of test pattern many times. Furthermore, generating such test a pattern with high speed is required because of the increase of the speed in the recent semiconductor devices to be tested.

A test pattern generator currently in use is basically formed of an accumulator type arithmetic unit which generates a long and large scale test pattern by programming arithmetic instructions and numbers of repetition in a program memory of the test pattern generator.

FIG. 10 shows an example of a conventional arithmetic circuit for the test pattern generator. The arithmetic circuit includes a control circuit 3, an arithmetic unit 1 and a register 2. The control circuit 3 has a program memory 31 and a clock generator 32 therein. A command read out from the program memory is provided to an input terminal A of the arithmetic unit 1. The output of the arithmetic unit 1 is connected to the register 2 whose output is connected to an input terminal B of the arithmetic unit 1. Also, an operation clock from the clock generator 32 is applied to a clock input terminal of the register 2. The resulted output X is obtained from the output of the arithmetic unit 1.

FIG. 11 shows an example of operation that implements a program example 1 with the use of the arithmetic circuit of FIG. 10.

First, an initial value "X=0" is stored in the first line of the program memory 31. In the next line, the instruction "Repeat 11 X=X+1" is stored which means to repeat an addition of one (1) for 11 times. In the third line of the program memory 31, in order that output value X be unchanged (remained as X), "X=X" is described. Thus, as in the foregoing, instruction data for the arithmetic unit 1 consists of a set of a numerical value, a sign and a command.

Therefore, at a first operation cycle, X=0 command is given to the terminal A of the arithmetic unit 1 from the program memory 31. The arithmetic unit 1 performs arithmetic operation. In the arithmetic unit 1, since the command from the memory 31 is X=0, the arithmetic unit 1 receives "0" as its input value without regard to the input value of other input terminal B. Thus, the value "0" is obtained as an output X of the arithmetic unit 1.

Next, the operation clock is applied to the register 2. In response to the clock, the register 2 latches 0 and its output value becomes 0. This numerical value is applied to another input terminal B of the arithmetic unit 1. Since the input terminal A is given X=+1 in this cycle and the input terminal B is given the value 0, the arithmetic operation "0+1" is performed by the arithmetic unit 1. The arithmetic unit 1 obtains an output X=1 as the result. Like this, only a numerical value and a sign are applied to another input terminal B of the arithmetic unit 1.

In the third operation cycle, "+1" command is continuously given at the terminal A, the arithmetic operation of plus one is carried out for the previous output value X=1 (terminal B). Therefore, an output X=2 is obtained as the result at the output of the arithmetic unit 1. In this manner, the arithmetic operation of the "+1" addition is carried out 11 (eleven) times.

In the above operational procedure in the conventional test pattern generator, the output of the register 2 changes its state by receiving the operation clock and the arithmetic unit 1 performs an arithmetic operation on the basis of the output value of the register 2. After the time required for this operation, supply of the operation clock for the next cycle becomes possible. This operation clock cycle composes the shortest pass of the pattern generation procedure. Accordingly, the time interval of the clock is the highest computation speed in this conventional test pattern generator.

FIG. 12 shows another example of arithmetic circuit in the conventional test pattern generator. In this example, the method of increasing the test pattern generating speed is accomplished by simply including a plurality of arithmetic units in a parallel form. Yet instructions for each arithmetic unit have to be prepared beforehand to accomplish this parallel operation.

In the example of FIG. 12, four arithmetic units 11∝14, four registers 21-24 and four program memories 41-44 are provided in parallel. Each set of the arithmetic unit, the register and the program memory is identical to the structure of FIG. 10. The registers 21-24 commonly receives a clock signal from a clock generator 45. The outputs $X_0$, $X_1$, $X_2$ and $X_3$ of the arithmetic units 11-14 are provided to a multiplexing circuit 5 which is also provided with a clock from the clock generator 45. The clock rate for the multiplexing circuit in this example should be four times faster than the example of FIG. 10 since the four arithmetic units 11-14 are provided in parallel.

Art example of configuration of the multiplexing circuit 5 is shown in FIG. 6. As shown in FIG. 6, the multiplexing circuit includes a multiplexer 502 and a counter 501. The counter 501 receives the clock from the clock generator 45 and outputs a 2-bits signal for the multiplexer 502. The 2-bits signal works as a select signal for the multiplexer 502. The outputs $X_0$, $X_1$, $X_2$ and $X_3$ of the arithmetic units 11-14 are multiplexed by the multiplexer 502 by the timing of the select signal from the counter 501 and the selected one of outputs is provided at the output terminal of the multiplexing circuit 5 as a resulted output X having four times faster speed than the data from the arithmetic units 11-14.

FIG. 7 is a timing chart showing a basic operation of the multiplexing circuit of FIG. 6. As is well known in the art, n parallel data provided to a multiplexer can be converted to a serial data having an n-times faster speed than that in each of the parallel data. In FIG. 7, input signals $X_0$, $X_1$, $X_2$ and $X_3$ having data a, b, c and d, respectively, supplied in parallel to the multiplexer 502 are converted to an output signal X having the data a, b, c and d in series which is four times faster than each of the input signals.

FIG. 13 is a schematic view showing an example of operation of the arithmetic circuit of FIG. 12 for implementing a test pattern generation based on a program example 1. As shown in a table of FIG. 13A, the program example 1 includes an initial value stored in the program memory 41, which is provided to the arithmetic unit 11. The initial value for the arithmetic unit 11 is:

$X_0=0$.

The initial value for the arithmetic unit 12 stored in the program memory 42 is:

$X_1=1.$

The initial value for the arithmetic unit 13 stored in the program memory 43 is:

$X_2=2.$

The initial value for the arithmetic unit 14 store in the program memory 44 is:

$X_3=3.$

These initial values are provided to corresponding input terminals of the arithmetic units 11–14 in the first cycle as shown in FIG. 13B. Accordingly, output data of the arithmetic units 11–14 in the first cycle represent the same value 0, 1, 2 and 3 as shown in FIG. 13B.

The next value for the arithmetic unit 11 and stored the program memory 41 is:

Repeat 2 $X_0=X_0+4.$

The next value for the arithmetic unit 12 and stored the program memory 42 is:

Repeat 2 $X_1=X_1+4.$

The next value for the arithmetic unit 13 and stored the program memory 43 is:

Repeat 2 $X_2=X_2+4.$

The next value for the arithmetic unit 14 and stored in the program memory 44 is:

$X_3=X_3+4.$

Accordingly, in the second cycle, each of the arithmetic units 11–14 adds four (4) to the data of the first cycle, since each of the registers 21–24 returns the previous data to other input terminals of the arithmetic units as shown in FIG. 13C. As a result, in the second cycle, the output data of the arithmetic units 11–13 represent 4, 5, 6 and 7 as shown in FIG. 13C.

In the third cycle, since the instruction for the arithmetic unit 11 is the same as the previous cycle, i.e., "Repeat 2 $X_0=X_0+4$" which requires to repeat the addition of four (4), the output data of the arithmetic unit 11 becomes 8 as shown in FIG. 13D. Similarly, in the third cycle, since the instructions for the arithmetic units 12 and 13 are also the same as that of the previous cycle, i.e., "Repeat 2 $X_1=X_1+4$" and "Repeat 2 $X_2=X_2+4$", respectively, the output data of the arithmetic units 12 and 13 become 9 and 10, respectively, as shown in FIG. 13D.

The output data of the arithmetic unit 14 in the third cycle represents 10 because of the instruction in the program memory 44 indicates:

$X_3=X_3+3.$

As described above, compared with the conventional example of FIGS. 10 and 11, the test pattern generation speed increases by the number of arithmetic units provided in parallel (4 times in the example of FIG. 12). However, since the program to be stored in the program memories 41–44 becomes complicated as exemplified above, and thus, a program development procedure for this example is time consuming and tedious.

SUMMARY OF THE INVENTION

Therefore, it is an object of the present invention to provide a solution to the foregoing problems found in the conventional test pattern generator. The present invention provides a test pattern generator which is capable of generating a high speed test pattern without requiring a complicated programming process.

A test pattern generator includes a parallel circuit for converting instruction signal to a parallel form and an instruction processing circuit which has n–1 instruction processors that perform arithmetic operations each operation of which is based on two instructions signals out of n parallel instruction signals. For each cycle of the operation clock, n registers are provided in the instruction processing circuit for shifting the instruction data to the next stage. The test pattern generator further includes an arithmetic circuit for receiving the instruction data from the instruction processing circuit and performing accumulator type functions by n arithmetic units. The arithmetic circuit includes a register which commonly provides data in the previous cycle to the inputs of all the arithmetic units. A multiplexing circuit is provided to convert the input data from the arithmetic circuit to a serial data having n times faster speed than each of the input data.

According to the present invention, the operation speed of the instruction signal from a program memory can be set to n times higher than the operation speed of each instruction signal in the instruction processing circuit. Also, the speed of the processed data from the multiplexing circuit can be multiplied by n times of the operational speed of the registers and the instruction processor in the instruction processing circuits or the arithmetic units in the arithmetic circuit. Therefore, arithmetic operations of n times faster than that of the conventional ones is available in the present invention. Furthermore, since the conventional instruction step can be used in a programming process of the test pattern generation, the present invention will not require any complicated programming procedures.

BRIEF DESCRIPTION OF THE DRAWINGS

FIG. 8 is a timing chart showing an example of operation according to the present invention.

DETAILED DESCRIPTION OF THE INVENTION

Figure 1:
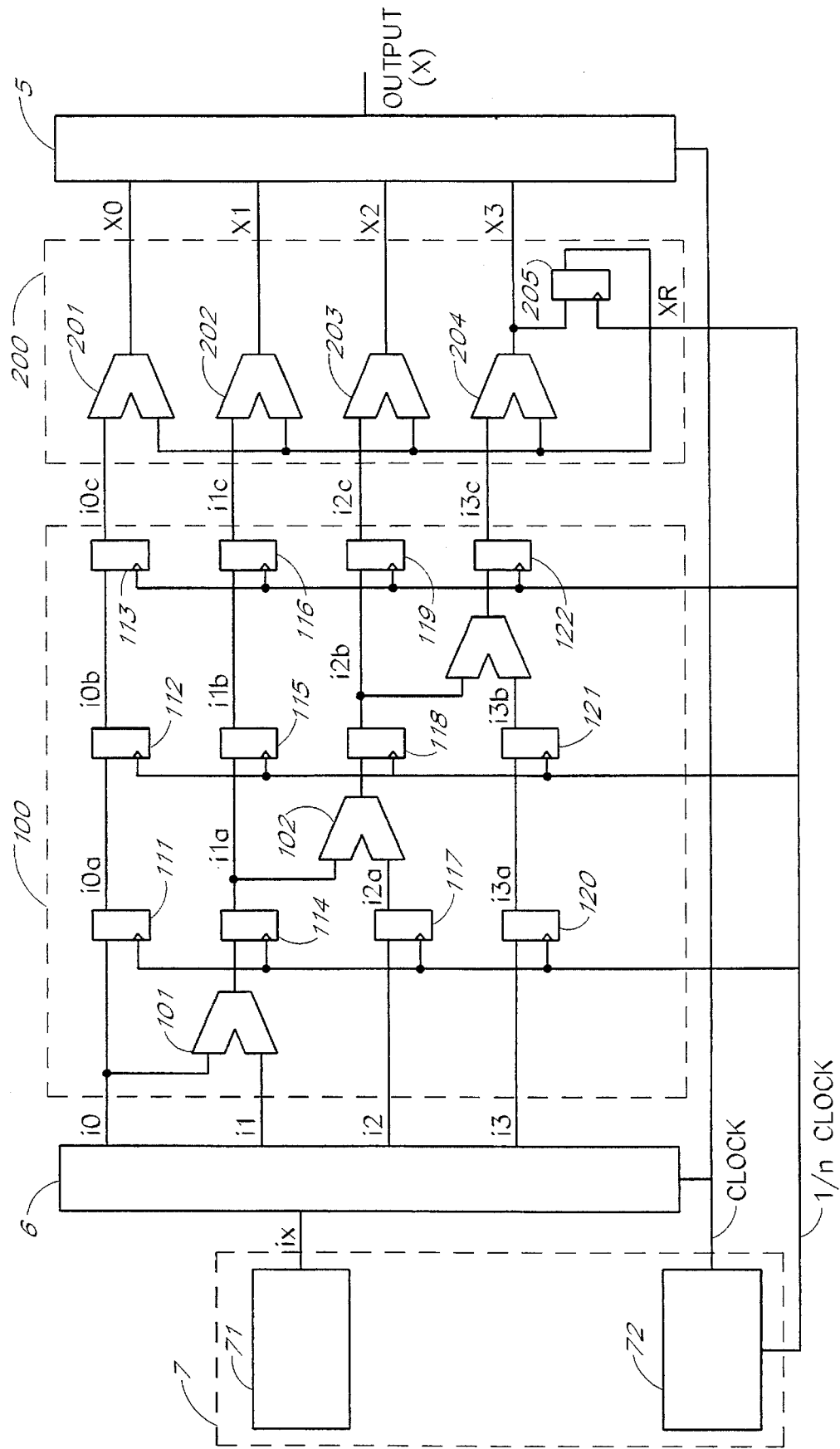
FIG. 1 is a block diagram showing a circuit configuration of the test pattern generator of the present invention.

FIG. 1 is a block diagram showing an embodiment of test pattern generator of the present invention. In this example, the speed of generating test patterns is increased by four times than the speed of the conventional test pattern generator since four parallel circuits are employed. In FIG. 1, the pattern generator includes a parallel circuit 6, a control circuit 7, an instruction processing circuit 100, an arithmetic circuit 200 and a multiplexing circuit 5.

The control circuit 7 has a program memory 71 which stores a series of instruction data and a clock generator 72 which generates an operation clock and a 1/n operation clock. The operation clock is n times faster than the 1/n operational clock (in the example of FIG. 1, n=4). The parallel circuit 6 converts the instructions signal ix from the program memory 71 to four parallel instruction signals i0, i1, i2 and i3 and allocates the instruction signals to four inputs of the processing circuit 100.

The instruction processing circuit 100 includes instruction processors 101, 102 and 103, and registers 111–122. The registers 111–122 are provided with the ¼ operation clock from the clock generator 72. As shown in FIG. 1, the four instruction signals received at the input terminals of the processing circuit 100 are processed by the instruction processors and registers in four signal paths and output as instructions i0c, i1c, i2c and i3c at four output terminals. The arithmetic circuit 200 includes four arithmetic units 201–204 each input terminal of which receives the instructions i0c, i1c, i2c and i3c, and a register 205 which is connected to the output of the arithmetic unit 204. Each of the other input terminals of the arithmetic units 201–204 is commonly provided with an output signal of the register 205.

Figure 6:
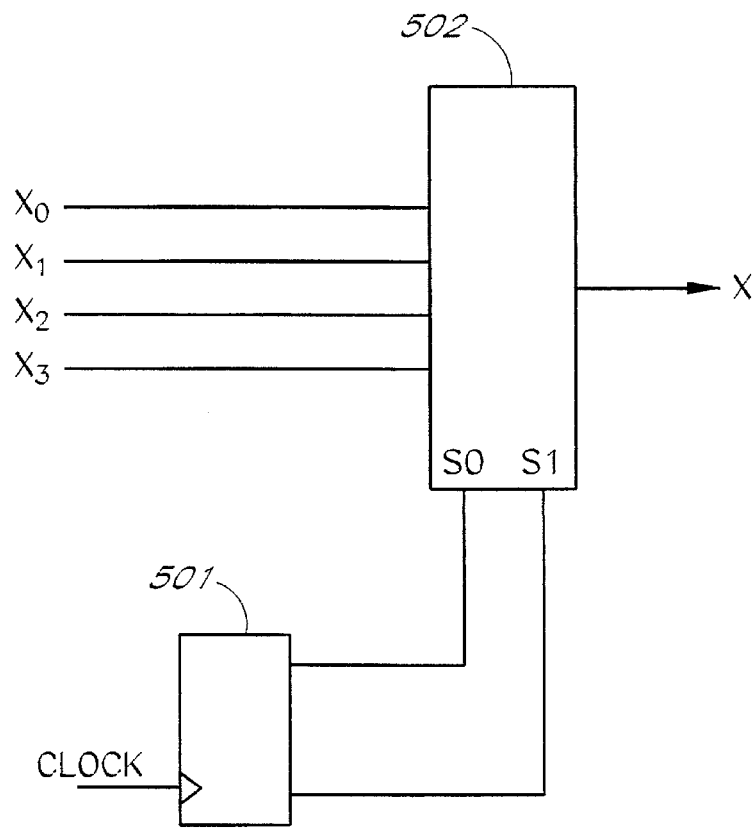
FIG. 6 shows an example of circuit structure for a multiplexing circuit.
Figure 7:
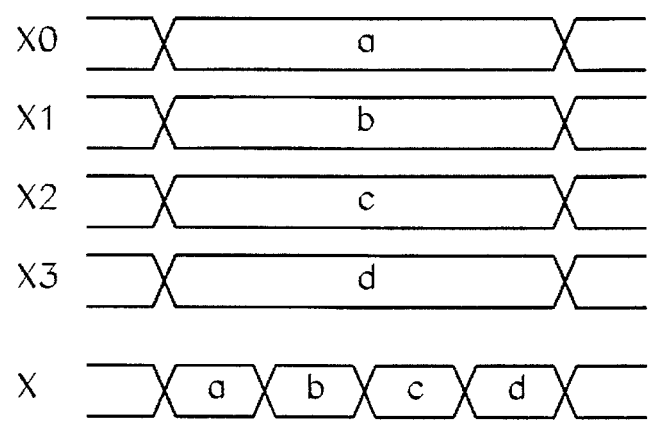
FIG. 7 is a timing chart showing an operation of the multiplexing circuit of FIG. 6.
Figure 9A:
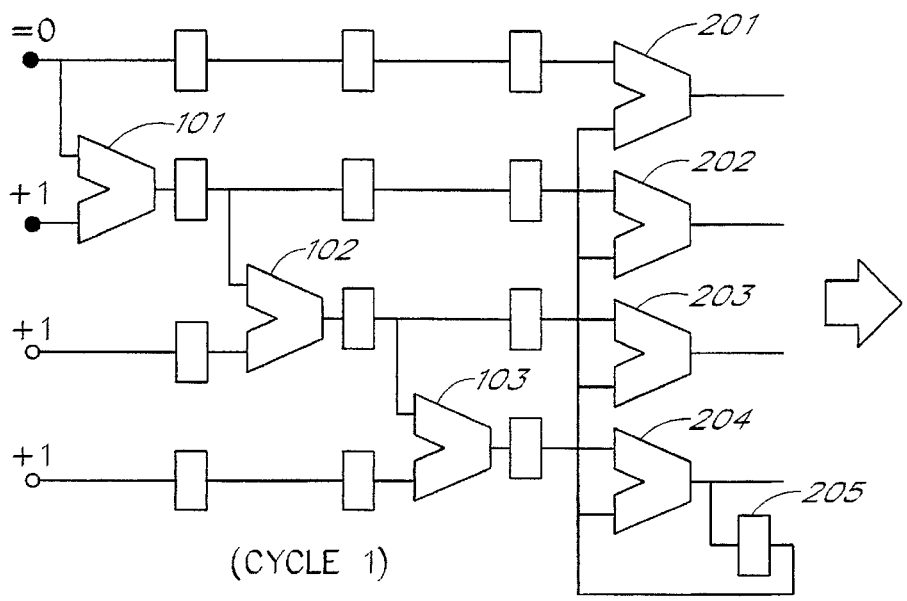
FIG. 9 is a graphic view showing another example of operation according to the present invention.
Figure 9B:
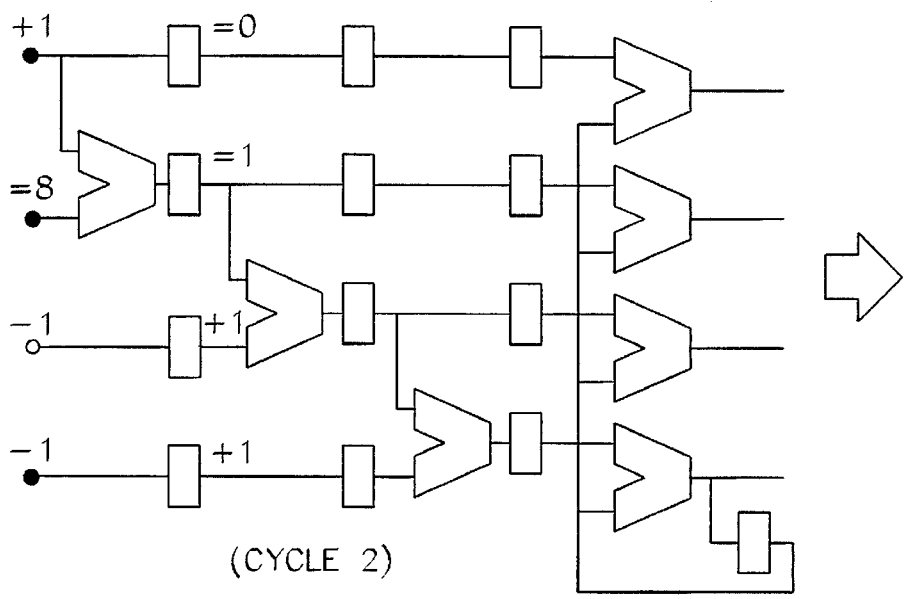
Figure 9C:
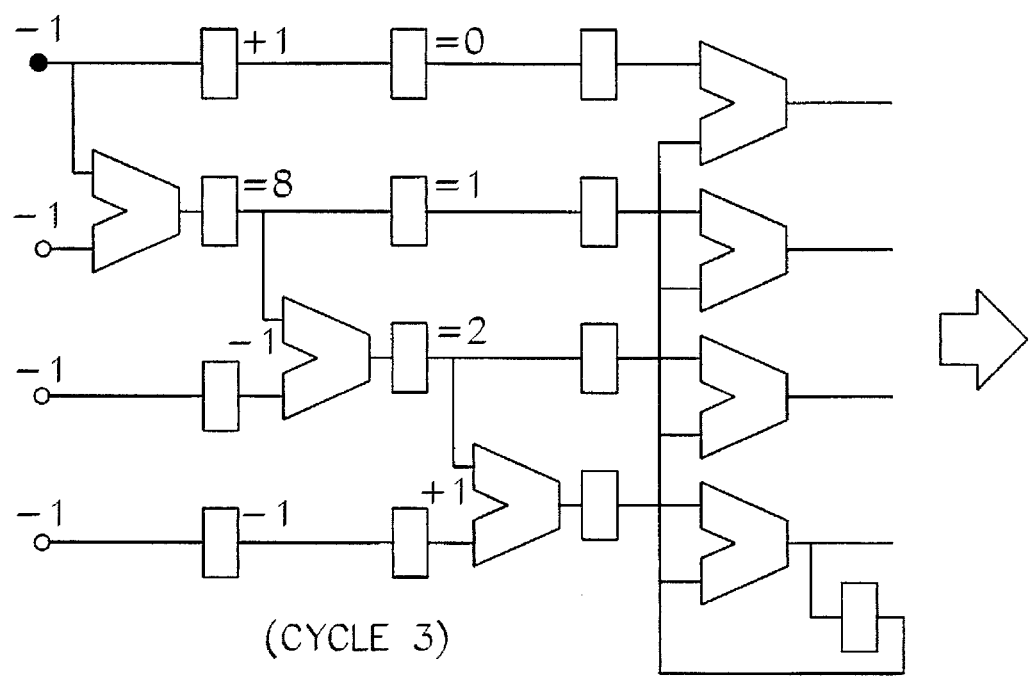
Figure 9D:
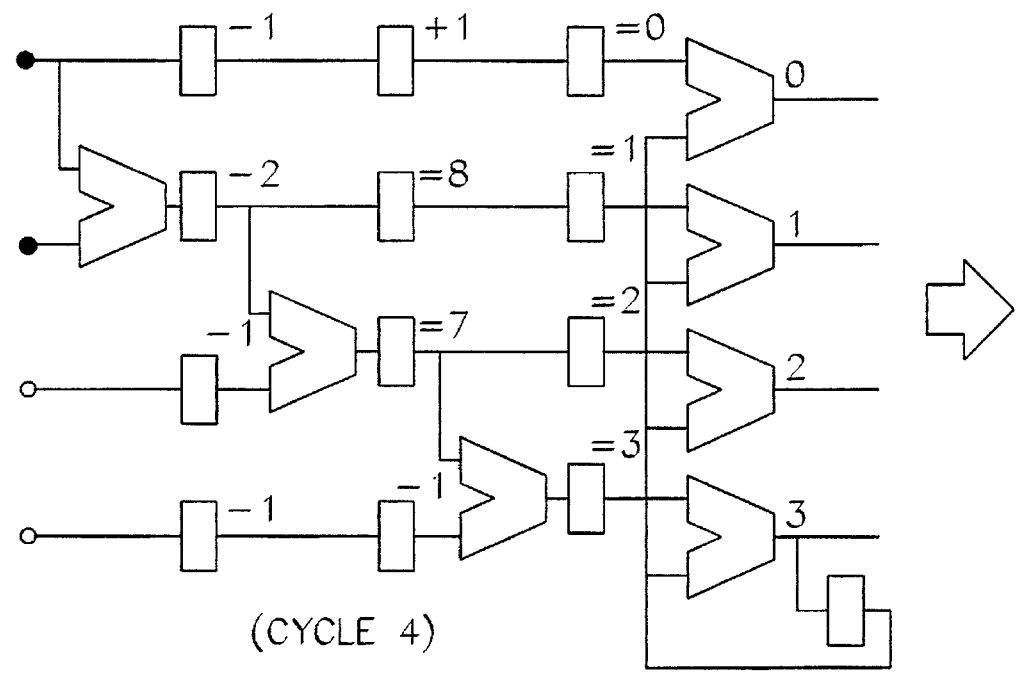
Figure 9E:
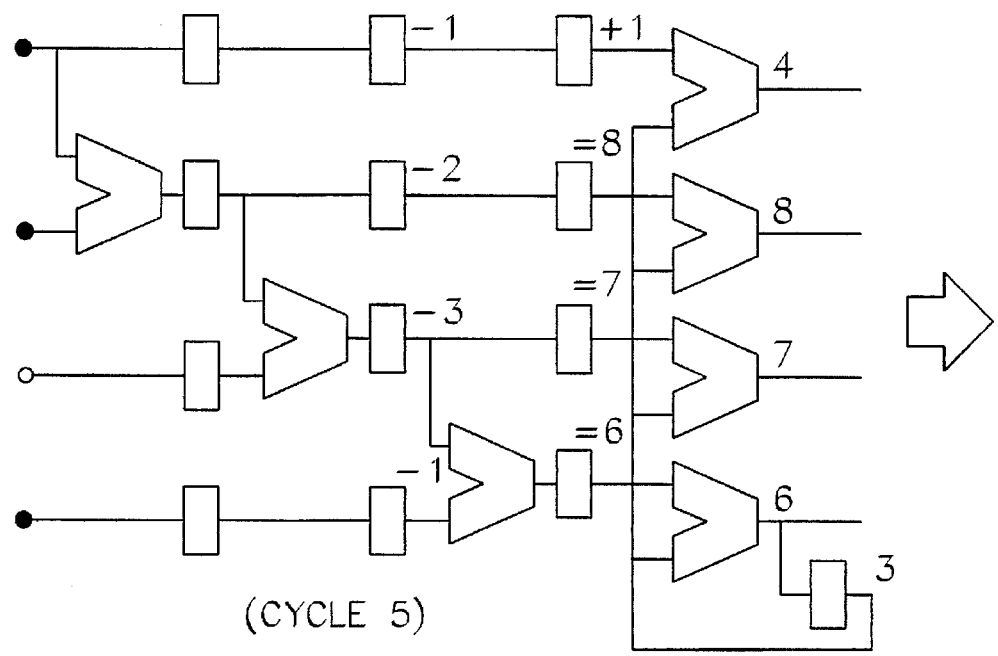
Figure 9F:
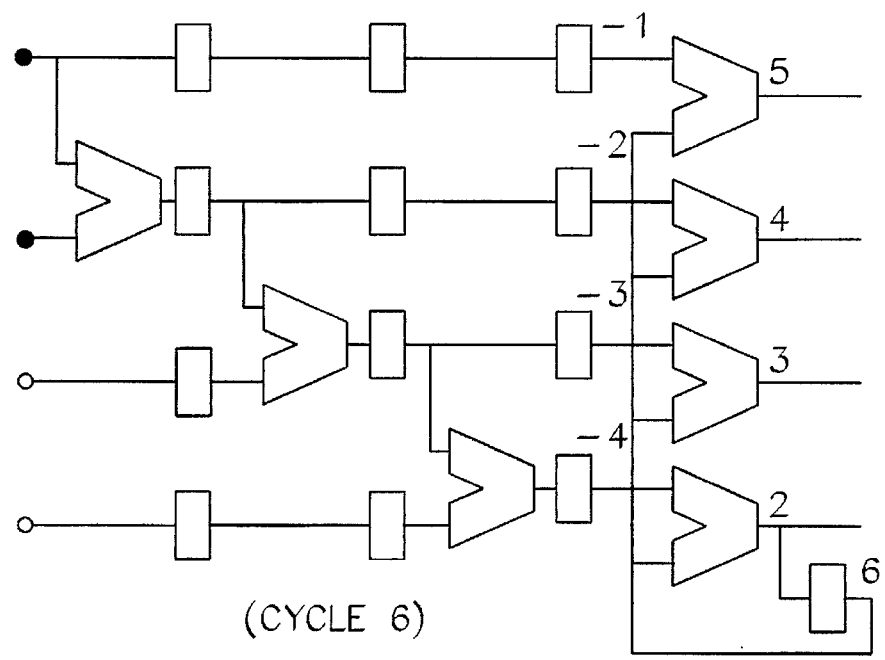
Figure 10:
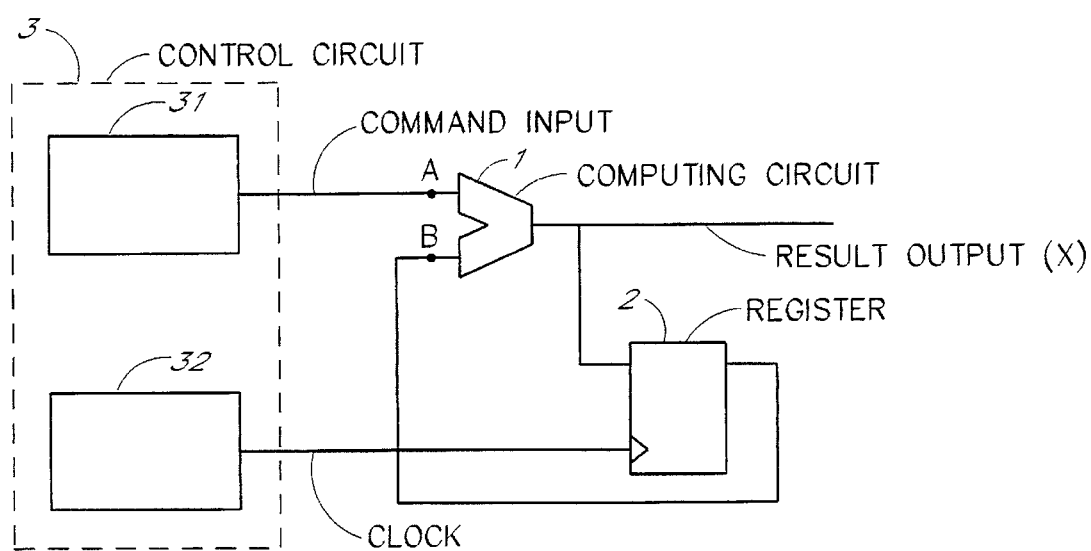
FIG. 10 is an example of an arithmetic circuit incorporated in the conventional test pattern generator.
Figure 11:
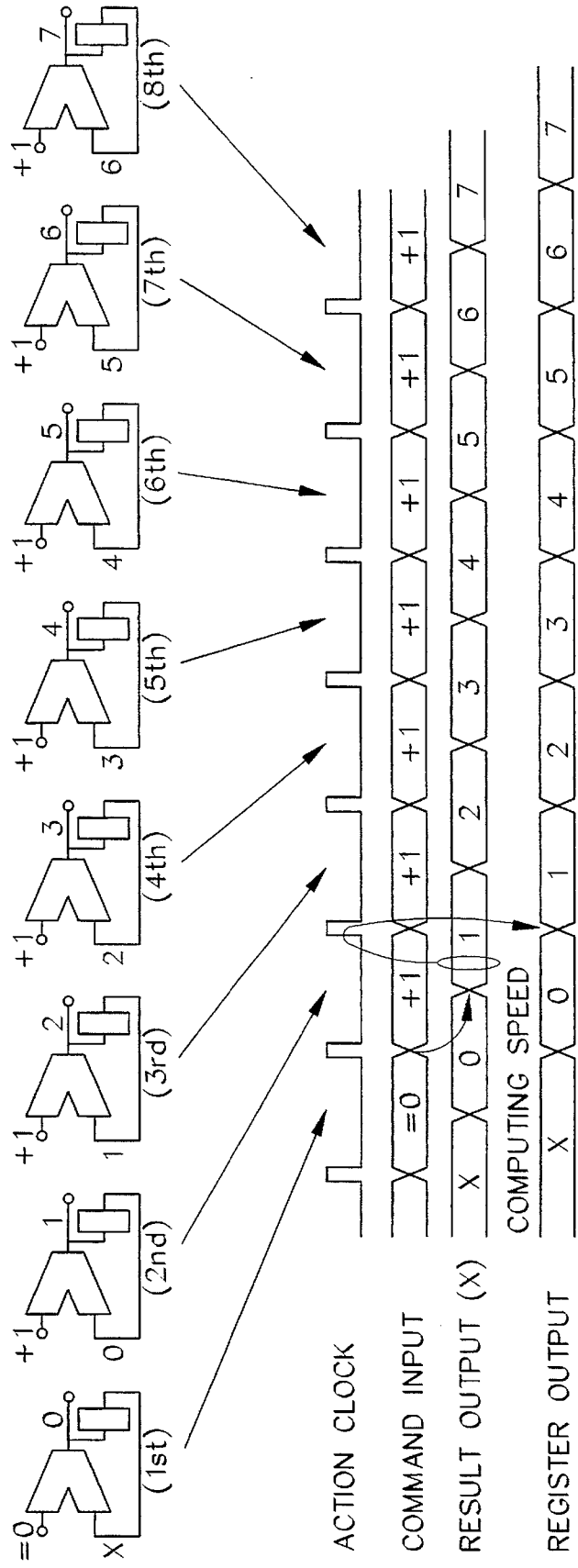
FIG. 11 is a graphic view showing an operation of the arithmetic circuit of FIG. 10.
Figure 12:
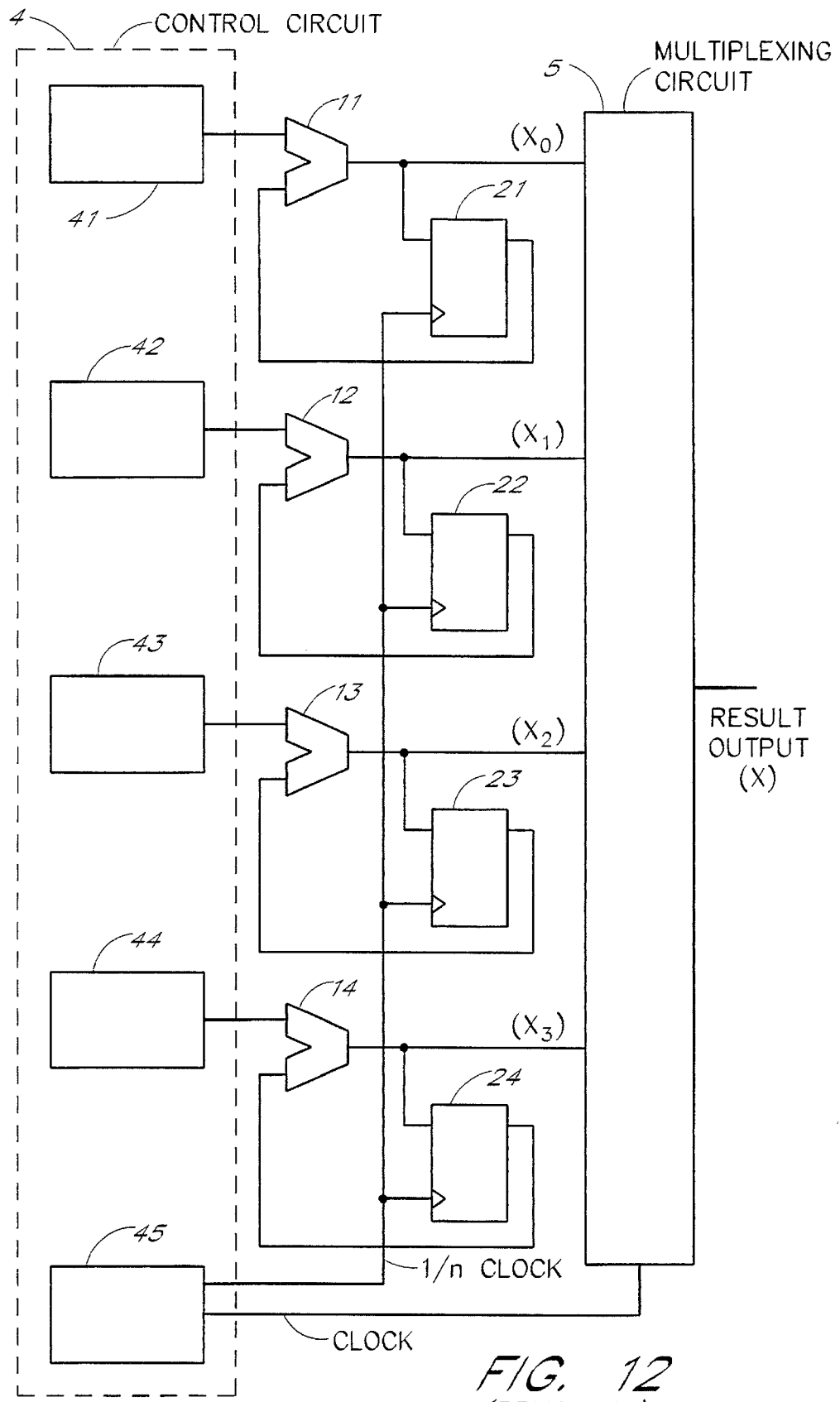
FIG. 12 shows another example of arithmetic circuit incorporated in the conventional test pattern generator.
Figures 13A, 13B, 13C:
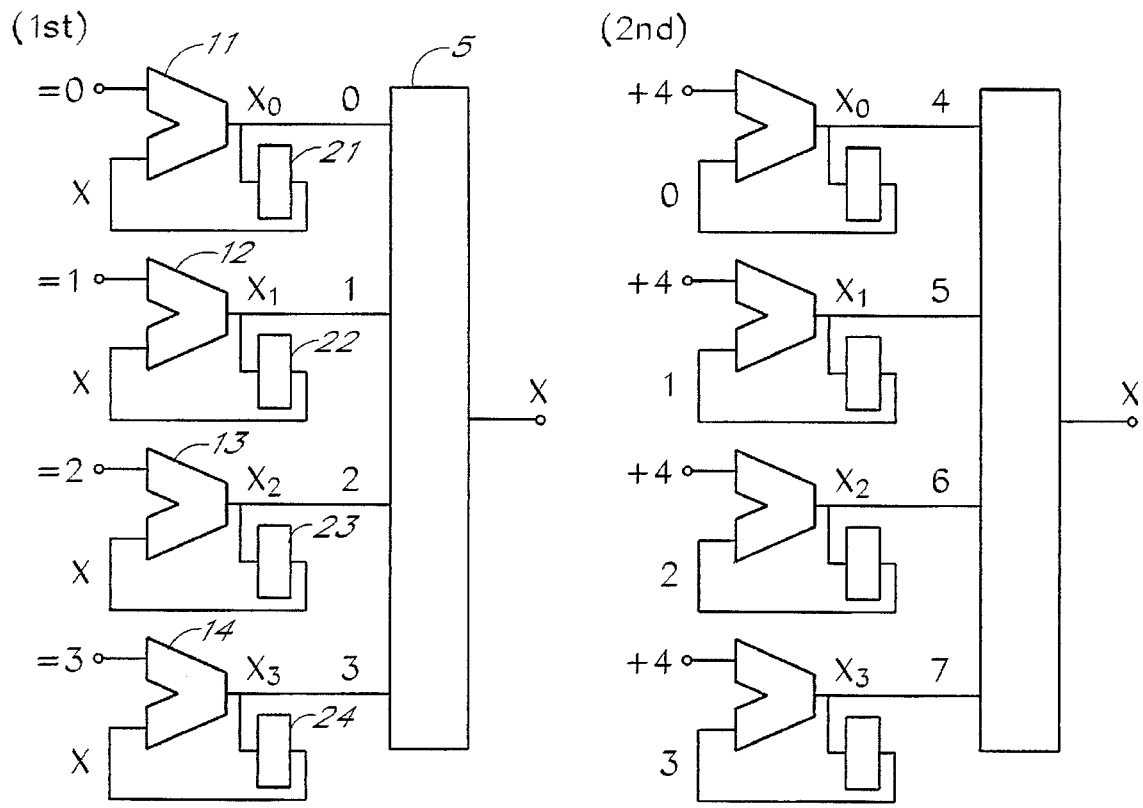
FIG. 13 is a graphic view showing an operation of the arithmetic circuit of FIG. 12.
Figure 13D:
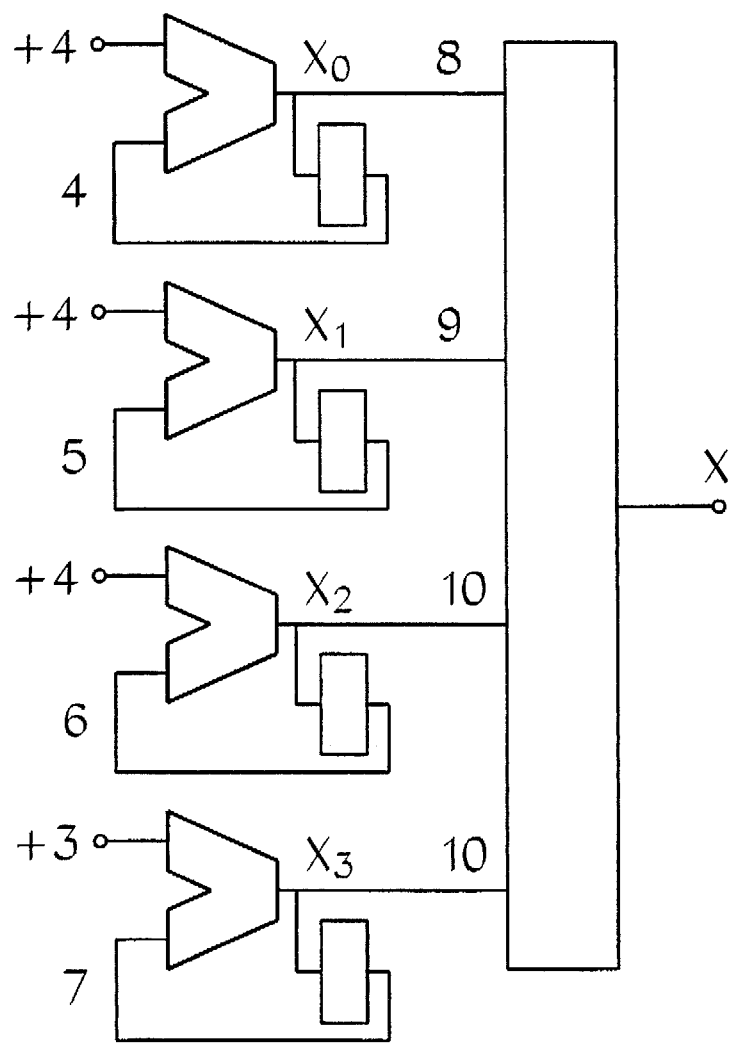

The multiplexing circuit 5 receives instruction signals $X_0$, $X_1$, $X_2$, and $X_3$ from the arithmetic circuit 200. An example of circuit configuration and the operation of the multiplexing circuit 5 are shown in FIGS. 6 and 7 as discussed above. The multiplexing circuit 5 converts the parallel input signal and outputs the instruction signal X in the serial form at its output.

Figure 4:
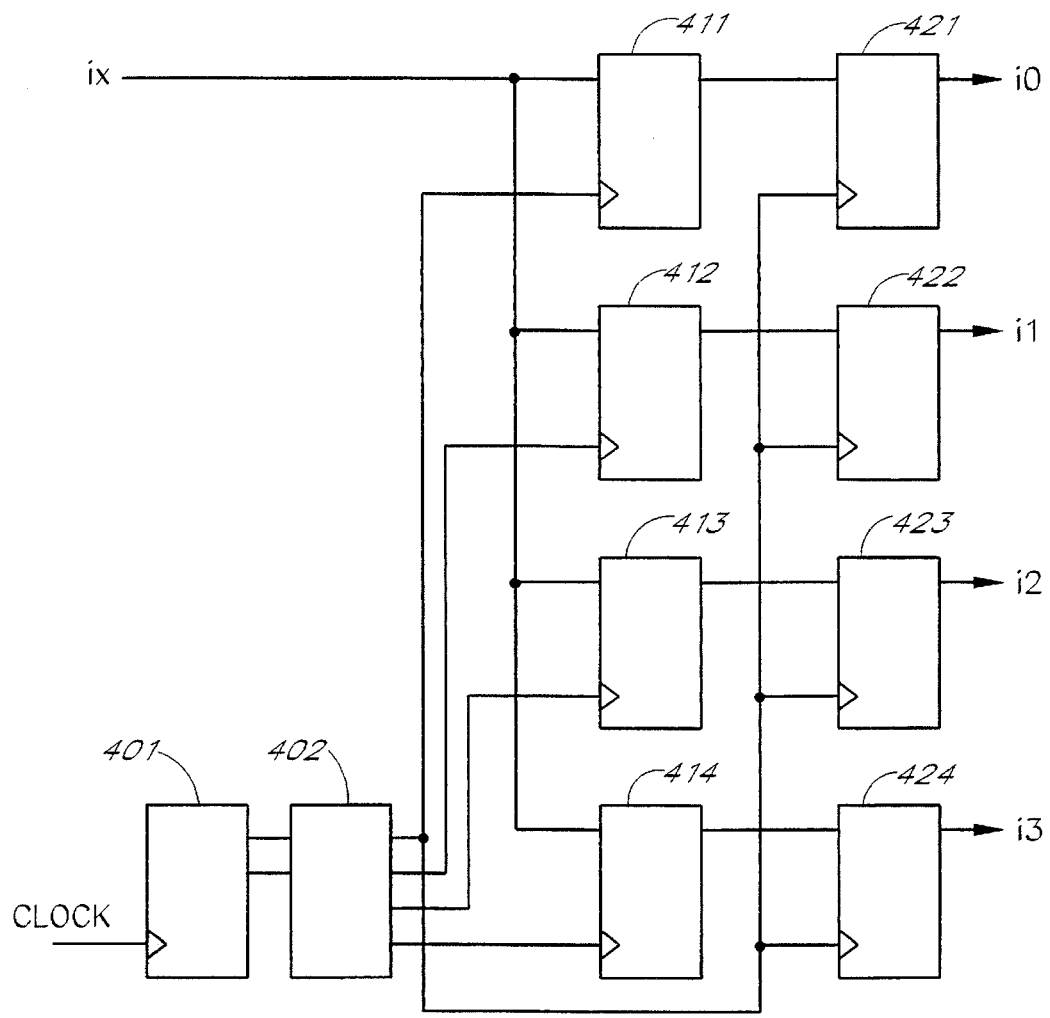
FIG. 4 shows an example of circuit configuration incorporated in the parallel circuit of FIG. 1.

FIG. 4 shows an example of circuit configuration incorporated in the parallel circuit 6. The basic purpose of the parallel circuit 6 is to convert a serial signal to a parallel signal. Namely, the instruction signal ix from the program memory 71 which is a serial signal is converted to the four parallel command signals i0, i1, i2 and i3 by the parallel circuit 6. The parallel circuit 6 includes a counter 401, a decoder 402, a set of registers 411–414 and another set of registers 421–424.

The counter 401 is provided with the operational clock generated by the clock generator 72. The output of the counter 401, which is for example a 2-bits signal, is supplied to the decoder 402. The decoder 402 generates 4 decoded signals based on this 2-bits signal and the 4 decoded signals are provided to corresponding clock terminals of the registers 411, 412, 413 and 414. Therefore, each of the registers 411–414 holds the instruction signal ix during the time which is 4 times of the period of the operation clock. Each instruction signal which is held in the corresponding registers 411–414 is shifted to the registers 421, 422, 423 and 424 whereby synchronized by the decoded signal (¼ operation clock) and output as the parallel instruction signals i0, i1, i2 and i3.

Figure 5:
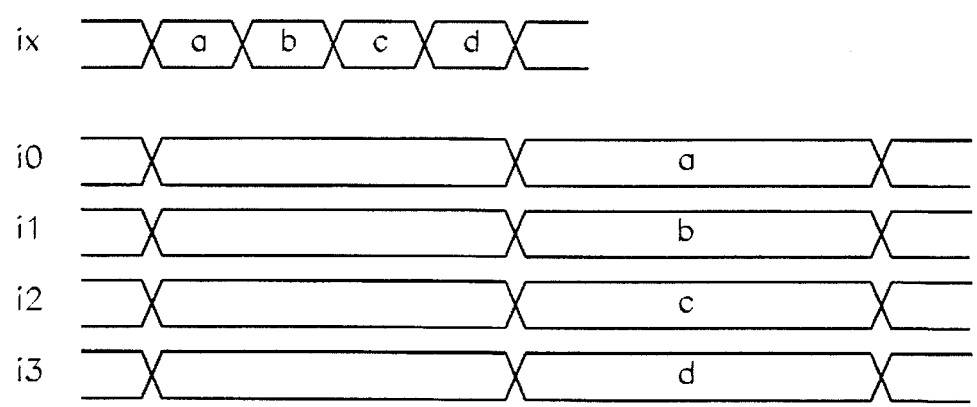
FIG. 5 shows a timing chart showing an operation of the parallel circuit of FIG. 4.

FIG. 5 is a timing chart showing an operation of the parallel circuit 6. The instruction signal ix has data a, b, c and d in series which has a signal rate equal to the operation clock. The data a, b, c and d are separated in the corresponding registers 411, 412, 413 and 414 and timing adjusted in the next cycle of the decoded signal by the registers 421, 422, 423 and 424. Therefore, the data a, b, c and d in the instruction signal ix becomes the parallel instruction signals i0, i1, i2 and i3 each of which has the corresponding one of the data a, b, c and d. The signal rate of the parallel instruction signals i0, i1, i2 and i3 is four times larger than that of the instruction signal ix.

Figure 2:
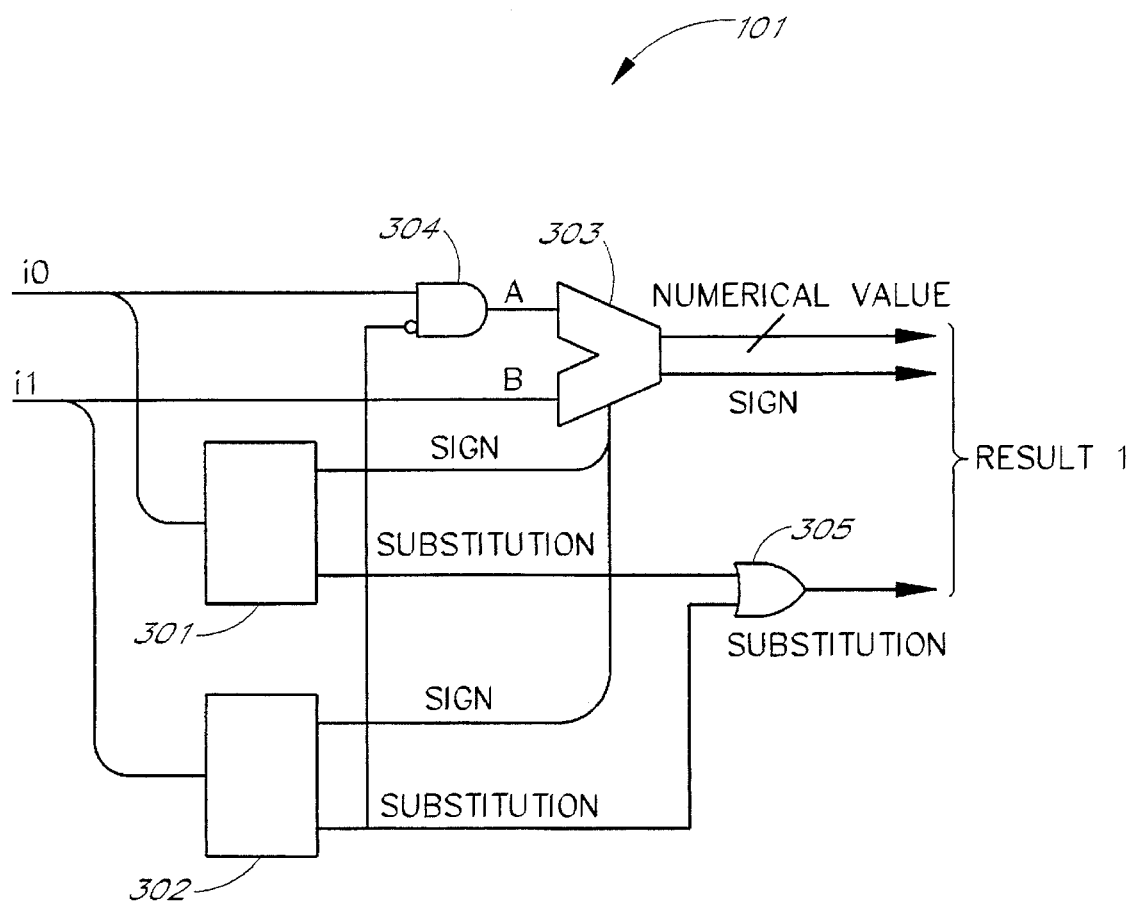
FIG. 2 shows a structure of an example of arithmetic circuits in accordance with the present invention.

The instruction processing circuit 100 processes the instruction signals i0, i1, i2 and i3 from the parallel circuit 6. The instruction signals i0 and i1 are provided to the instruction processor 101 having two input terminals. The instruction processor 102 receives the instruction signal i2 through the register 117 while the instruction processor 103 receives the instruction signal i3 through the registers 120 and 121. An example of the more detailed structure of the instruction processors 101–103 to be used in the present invention is shown in FIG. 2. The instruction processor 101 includes instruction decoders 301 and 302, an AND gate 304, an arithmetic unit 303 and an OR gate 305.

The instruction signal i0 is applied to an input terminal of the AND gate 304 as well as to the instruction decoder 301. The output of the AND gate 304 is connected to an input terminal A of the arithmetic unit 303. The instruction signal i0 includes a sign in addition to a numerical value and also a command set that shows substitution. The instruction decoder 301 detects the "sign" command and the "substitution" command in the instruction signal i0. The sign (+/−) that is detected by the instruction decoder 301 is given to the arithmetic unit 303. Also, the detected "substitution" command is given to the OR gate 305.

The instruction signal i1 is applied to the other input terminal B of the arithmetic unit 303. Also, the instruction decoder 302 detects the "sign" command and the "substitution" command in the instruction signal i1. The detected sign (+/−) command is provided to the arithmetic unit 303. The detected "substitution" command is provided to the other input terminal of the OR gate 305. Furthermore, the detected "substitution" command in the instruction signal i1 is reversed and supplied to the AND gate 304. In this way, when the "substitution" command is included in the instruction signal i1, the instruction signal i0 is disregarded. The arithmetic unit 303 operates based solely on the instruction signal i1 and outputs a "result i1" which is inclusive of the numerical value and the sign. The OR gate 305 outputs the "substitution" command to be used in the next step.

Figure 3:
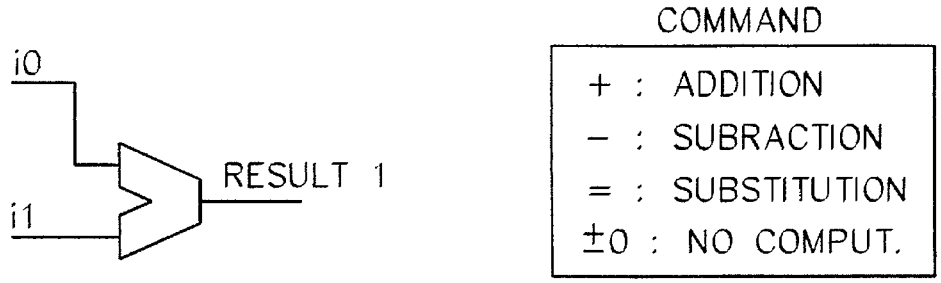
FIG. 3 shows arithmetic functions of an arithmetic unit of the present invention and associated commands applied to the arithmetic unit.

Arithmetic functions of the arithmetic units 101–103 are shown in FIG. 3. Arithmetic commands for the arithmetic unit are classified into addition, subtraction, substitution and no computation. When the instruction i0 and the instruction i1 are given, the "result i1" of the arithmetic operation is obtained as shown in the table of FIG. 3.

As shown in FIG. 1, the output of the arithmetic unit 101 is connected to the register 114. By the timing of the ¼ operation clock, the output of the register 114 becomes i1a.

At the same time, the registers 111, 117 and 120 provide instruction results i0a, i2a and i3 which correspond to the instruction signals i0, i2 and i3 to the next stage. The arithmetic unit 102 is provided with the instruction signals i0a and i2a and performs the arithmetic operation in the same way as in the arithmetic unit 101 as discussed in the foregoing.

The result of the arithmetic operation in the arithmetic unit 102 is taken by the register 118 by the timing of the ¼ clock. Thus, the output of the register 118 becomes an instruction signal i2b. At the same time, the registers 112, 115 and 121 shift the instruction from the registers 111, 114 and 120, respectively, which are now instruction signals i0b, i1b and i3b as shown in FIG. 1. Similarly, based on the instruction signals i2b and i3b provided, the arithmetic unit 103 performs the arithmetic operation which yields an instruction signal i3c through the register 122. The registers 113,116 and 119 also send instruction signals i0c, i1c and i2c, respectively. As in the foregoing, the instruction processing circuit 100 of the present invention includes three (n–1) arithmetic units 101, 102 and 103 for four (n) instruction signals.

The arithmetic circuit 200 receives the instruction signals i0c, i1c, i2c and i3c at corresponding inputs of the arithmetic units 201, 202, 203 and 204 as shown in FIG. 1. The register 205 provides the data XR from the arithmetic unit 204 in the previous cycle to the other inputs of the arithmetic units 201, 202, 203 and 204. The arithmetic circuit 200 performs an arithmetic operation under this configuration and generates output data $X_0$, $X_1$, $X_2$ and $X_3$ which are received by the multiplexing circuit 5.

The multiplexing circuit 5 converts the parallel data $X_0$, $X_1$, $X_2$ and $X_3$ from the arithmetic circuit 200 to a serial data X. The data X has a four times faster speed than each of the parallel data $X_0$, $X_1$, $X_2$ and $X_3$ since the operation clock is used in the multiplexing circuit 5. As described in the foregoing, the multiplexing circuit 5 is configured as shown in the example of FIG. 6. FIG. 7 is a timing chart that showing an operation of the multiplexing circuit 5, as also described in the foregoing.

FIG. 8 shows a timing chart showing an overall operation of the pattern generator of FIG. 1 based on an example of program shown in the upper right of FIG. 8. In this example, the first values of the parallel instruction signals I0, i1, i2, i3 from the parallel circuit 6 are 0, +1, +1, +1, respectively. The result of arithmetic operation (0+1) in the arithmetic unit 101 is "1" which is held by the register 114 in the second cycle of the ¼ operation clock. Therefore, in the second cycle, instruction signals i0a, i1a, i2a and i3a respectively show 0, 1, 1 and 1.

Since both input signals for the arithmetic unit 102 indicate "1", the output thereof shows "2" which is held by the register 118 in the third cycle. Therefore, in the second cycle, instruction signals i0b, i1b, i2b and i3b respectively show 0, 1, 2 and 1. The result of arithmetic operation in the arithmetic unit 103 is "3", since the input signals thereto are "2" and "1", which is held by the register 122 in the fourth cycle. Therefore, in the fourth cycle, instruction signals i0c, i1c, i2c and i3c respectively show 0, 1, 2 and 3.

The instruction signals i0c, i1c, i2c and i3c are received by the arithmetic circuit 200 wherein the register 205 commonly provides the data $X_R$ in the instruction signal i3c in the previous cycle to the arithmetic units 201–204 for the accumulating operation in the arithmetic units 201–204. Therefore, for example, in the third cycle of FIG. 8E, since the value "3" in the second cycle is held by the register 205 and provided to the arithmetic units 201–204, the output data $X_0$, $X_1$, $X_2$ and $X_3$ become 4, 5, 6 and 7, respectively. This is because the other inputs of the arithmetic units 201–204 are provided with the instruction signals i0c, i1c, i2c and i3c indicative of 1, 2, 3 and 4, respectively. The parallel output data $X_0$, $X_1$, $X_2$ and $X_3$ are converted to a serial data X which has a repetition rate of four times faster than that of each of the parallel data by the multiplexing circuit 5. As a result, in the above example, the serial data X include a train of data of "1, 2, 3, 4, 5, 6, 7, 8 . . ."

FIG. 9 shows another operational example of the test pattern generation in accordance with the present invention. In FIG. 9, the operation starts from an initial value "0". After an addition command is implemented by four times, the next initial value "8" is set up. Then a subtraction command is implemented by six times. Even in this type of situation where a substitution command is provided during the operation, the test pattern generation is accomplished without any obstructions, i.e., without receiving any adverse effects of arithmetic operations in the prior operation cycles.

As described above, in the present invention, the operation speed of the instruction signal ix can be set to four times (n times) higher than the operational speed of each instruction signal i0, i1, i2 and i3 in the instruction processing circuit 100. Also, the speed of the processed data X from the multiplexing circuit 5 can be multiplied by four times (n times) of the operational speed of the registers and arithmetic units in the preceding circuits. In other words, in comparison with conventional operation speed, four times (n times) faster arithmetic operation is available in the present invention. Furthermore, since the conventional instruction step can be used in the programming of the test pattern generation, the present invention will not require any complicated programming procedures.

What is claimed is:

1. A test pattern generator, comprising:

a parallel circuit for converting an instruction signal of a serial form to n instruction signals of a parallel form;

an instruction processing circuit having n–1 instruction processors for performing arithmetic operations based on instruction data in said instruction signals given in said parallel form and a plurality sets of registers each set of which is commonly provided with a lower speed clock signal, each of said instruction processors providing the results of said arithmetic operation to an input of another instruction processor;

an arithmetic circuit receiving the parallel data from said instruction processing circuit and performing arithmetic operations by n arithmetic units therein, said arithmetic circuit including a register which provides the data in the previous cycle to the other inputs of all of the arithmetic units; and a multiplexing circuit for converting the parallel data from said arithmetic circuit to a serial form having n times faster than the parallel data based on a higher speed clock signal having n times faster speed than said lower speed clock.

2. A test pattern generator as defined in claim 1, wherein, each of said instruction processors includes:

a first input terminal and a second input terminal;

an arithmetic unit for performing an arithmetic operation for instruction data given to said input terminals;

an AND gate connected to said first input terminal;

a first instruction decoder for detecting a sign and a substitution command from the instruction data provided at said first input terminal;

an OR gate connected to said detected substitution command signal from said first instruction decoder;

a second instruction decoder for detecting a sign and a substitution command from the instruction data provided at said second input terminal, said detected substitution command being supplied to other input of said OR gate, and the reversed signal of said detected substitution command signal being provided to other input terminal of said AND gate.

3. A test pattern generator as defined in claim 1, wherein each of said plurality sets of register in said instruction processing circuit includes n registers in a parallel form, each set of said registers shift the instruction data to the next set of registers based on the clock signal, one of said n registers in said each set of said registers receiving output data from one of said instruction processors to provide said output data to said another instruction processor in synchronism with said lower speed clock signal.

* * * * *